United States Patent [19]

Reimers et al.

[11] 4,061,973
[45] Dec. 6, 1977

[54] SYNTHESIZER

[75] Inventors: Fred Alan Reimers, Lake in the Hills; Robert Martin Beckmann, Hanover Park; William Arthur Burzynski, Des Plaines; Dennis Eugene Tomlinson, Elgin; William Henry Schwartz, Hoffman Estates, all of Ill.

[73] Assignee: Motorola, Inc., Schaumburg, Ill.

[21] Appl. No.: 670,296

[22] Filed: Mar. 25, 1976

[51] Int. Cl.² .................................. H04B 1/40
[52] U.S. Cl. ........................... 325/17; 325/25; 331/18
[58] Field of Search .......... 325/17, 18, 15, 20, 325/25, 21; 331/1 R, 17, 18, 25, 30

[56] References Cited

U.S. PATENT DOCUMENTS 3,696,422  10/1972  Burrell ................. 325/17
3,983,484  9/1976  Hodama ................. 325/25

Primary Examiner—Benedict V. Safourek
Assistant Examiner—Michael A. Masinick
Attorney, Agent, or Firm—James W. Gillman; James P. Hamley

[57] ABSTRACT

The synthesizer uses phase lock loop techniques to generate either the carrier signal for an associated transmitter or the injection signal for an associated receiver. A programmable divider controls the specific channel to which the synthesizer tunes the transmitter or receiver whereas operation in the transmit or receive mode is dependent upon which of two oscillators is coupled in the synthesizer circuit. The oscillators are designed to run at two frequencies having a difference equal to the intermediate frequency of the receiver. This allows the one output from the synthesizer to be used in both the transmit and receive modes.

10 Claims, 2 Drawing Figures

SYNTHESIZER

BACKGROUND OF THE INVENTION

The present invention relates to the frequency synthesizer art and, in particular, to a frequency synthesizer for use as the frequency controlling circuit in a radio transceiver.

Frequency synthesizer designs are well known, especially in the communication art. When used in combination with radio transmitters or receivers, the synthesizer produces any one of several oscillating signals, each of which is at a desired frequency for proper transmitter or receiver operation. A particularly useful feature of synthesizers is that they may be programmed to operate in discrete frequency steps. This allows tuning of the receiver or transmitter to a multitude of selected frequencies, thus allowing multichannel operation.

A fundamental problem with synthesizer designs is that they have been relatively expensive to produce. This is due to the large number of components required, along with the manufacturing costs for the total assembly. A reduction in the number and cost of components has often resulted in a sacrifice in frequency accuracy, which is especially undesireable in applications wherein the synthesizer controls a radio frequency transmitter.

A particularly useful application for synthesizers would be in citizens band transceivers wherein a user may wish to operate on any one of 23 channels. Due to the aforementioned prohibitive cost of synthesizers, however, very few synthesizers have found use in citizens band equipment.

SUMMARY OF THE INVENTION

It is an object of this invention, therefore, to provide a precise yet inexpensive synthesizer.

It is a particular object of this invention to provide the above described synthesizer which finds utility in citizens band radio equipment.

Briefly, according to the invention, a radio frequency synthesizer for use in a transceiver has as its first element a reference oscillator which generates a predetermined, or reference frequency signal. The reference oscillator signal couples to the phase comparator which phase compares the reference oscillator signal with a signal at the phase comparator second input, producing a resultant error signal representative of the phase differences therebetween at its output terminal. The error signal output of the phase comparator is low pass filtered and applied to the voltage control terminal of a voltage controlled oscillator. The voltage controlled oscillator produces an oscillator signal at its output, which output signal has a frequency dependent on the signal applied to the voltage control terminal. The output from the voltage control oscillator is both the output from the synthesizer, and one of two inputs to a mixer. The other input to the mixer is from either a transmit oscillator or a receive oscillator. Dependent on whether the transceiver is in the transmit or receive mode, a means switchably couples either the transmit oscillator signal or the receive oscillator signal to the remaining mixer input. The mixer operates in a conventional manner to produce at its output a signal having a frequency equal to the difference in frequency of the two signals applied at its input. Thereafter, the difference signal is low pass filtered and applied to the input of a programmable divider. In response to signals at its control terminals, the programmable divider produces at its output a frequency division of the signal appearing at its input. Thus, the frequency divisor is programmable dependent on the status of the control terminals. A channel selector couples to the control terminals of the programmable divider for selectively controlling the frequency divisor of said divider. Finally, the output of the frequency divider couples to the second input of the aforementioned phase comparator whereby the entire system operates in a phase lock loop mode to produce at the output of the voltage controlled oscillator any selected one of a multitude of desired output frequency signals.

DESCRIPTION OF THE PREFERRED EMBODIMENT OF THE INVENTION

Figure 1:
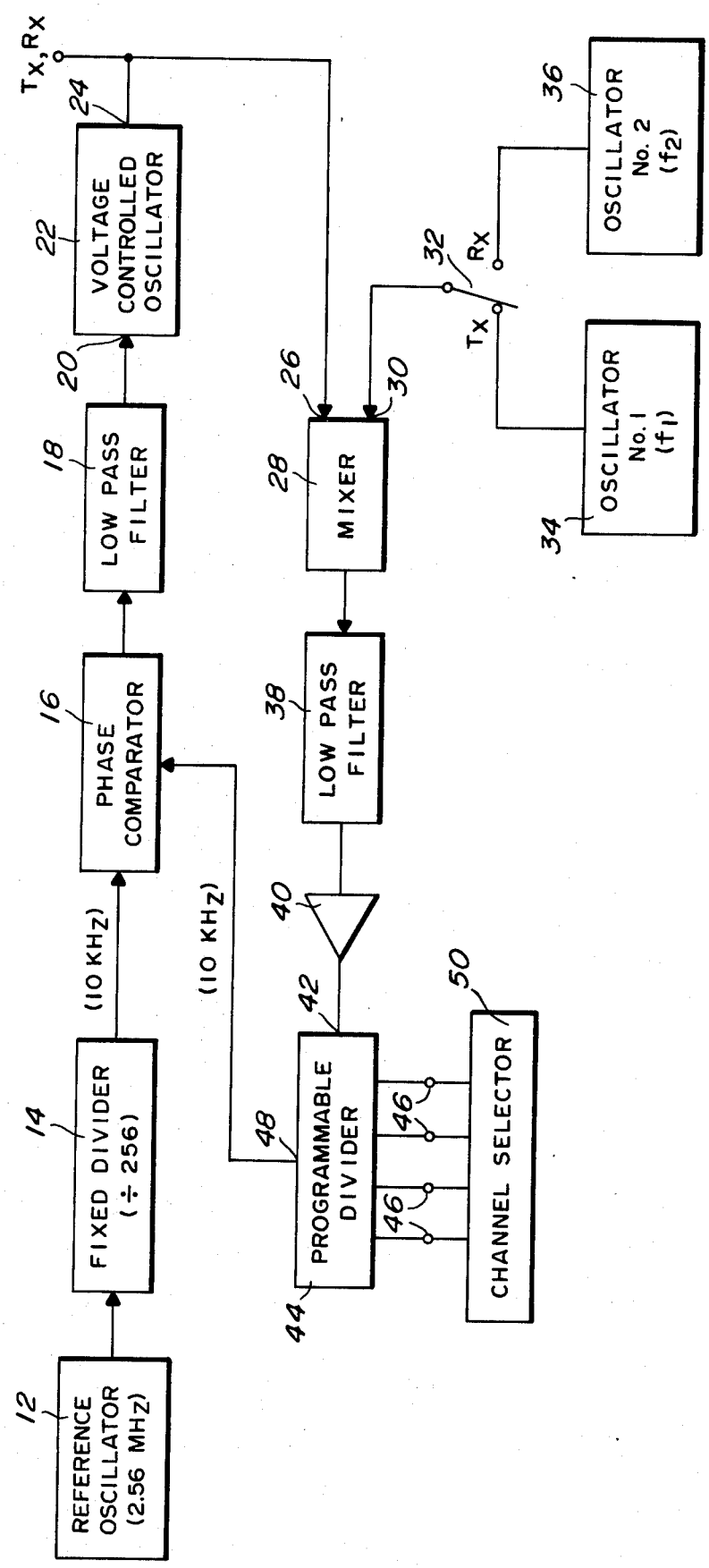
FIG. 1 is a block diagram of the frequency synthesizer according to the invention.

FIG. 1 illustrates, in block diagram form, the preferred embodiment of the frequency synthesizer. A reference oscillator 12, running at a frequency of 2.56 megahertz, feeds to a frequency divider 14. Divider 12 is a fixed divider having a divisor of 256. Thus the output of fixed divider 14 is a 10 kilohertz signal which feeds to one input of a phase comparator 16. The output of phase comparator 16 is low pass filtered via filter 18 and applied to the voltage control terminal 20 of a voltage controlled oscillator 22. The oscillator produces at its output terminal 24 an oscillating signal whose frequency is dependent on the signal applied to the voltage control terminal 20. The voltage controlled oscillator output 24 feeds both to either the transmitter or receiver and to the first input 26 of a mixer stage 28. A second input 30 of mixer 28 feeds via a switch 32 to either a first oscillator 34 or a second oscillator 36 dependent on whether the synthesizer is operating in the transmit or receive modes, respectively. The difference between the frequency of oscillation of first oscillator 34 ($f_1$) and the second oscillator 36 ($f_2$), i.e. $f_1 - f_2$, is, preferably, equal to the intermediate frequency of the receiver. In the present example, the synthesizer is intended for use in a citizens band radio using an intermediate frequency of 455 kilohertz. Thus, oscillator No. 1 was chosen to have a frequency $f_1$ of 29.485 megahertz whereas oscillator No. 2 was designed to operate at a frequency $f_2$ of 29.030 megahertz.

The output of the mixer 28 includes sum and difference frequencies of the two input signals. To extract only the difference frequency a low pass filter 38 is incorporated which passes to its output only the difference frequency between the signals at mixer inputs 26 and 30. This difference frequency is thereafter amplified and squared by an amplifier 40 and fed to the input 42 of a programmable divider 44. Programmable divider 44, in response to signals appearing at its control terminals 46 frequency divides signals at its input 42, reproducing these signals at its output terminal 48. The signals at the control terminals 46 are controlled by a channel selector 50 which applies appropriate signals to control terminals 46 to select a desired divisor. The resultant divided signal appears at the divider output 48 and is thereafter coupled to the second input of phase comparator 16, thus completing the loop.

Synthesizer operation may be understood follows. The signal produced by the reference oscillator 12 and fixed divider 14 is a constant 10 kilohertz signal which is applied as a reference frequency signal to one input of the phase comparator 16. The phase comparator 16 compares the reference 10 kilohertz signal with the signal produced by the programmable divider 48. If there is a large error in phase between the two signals, and thus potentially a large error in frequency, there is a large error signal produced by the phase comparator, which after low pass filtering in filter 18, appears at the voltage control terminal 20 of the voltage controlled oscillator 22. This error signal causes the voltage controlled oscillator to change the frequency at its output in such a way that when mixed in mixer 28 with the signal from either of the oscillators 34, 36 the resulting difference signal, after low pass filtering in filter 38, squaring in squaring amplifier 40, and passing to the programmable divider 44 will tend to change in phase and frequency until both inputs to the phase comparator are in phase lock. By changing the divisor of programmable divider 44, i.e. by selection of a different channel via channel selector 50, the output of the voltage controlled oscillator 24 may be caused to jump in discrete frequency increments whereby it jumps precisely from one selected channel to the next. This is especially useful in, for example, citizens band radio operation wherein any of a large number of channels may be selected.

Whereas channel selector 50 is used for switching among channels, switch 32 is used for switching from the transmit to the receive mode. Since the difference in frequency between the two oscillators 34, 36 is precisely the intermediate frequency of the receiver, the resulting output of the voltage controlled oscillator 22 which had been used as the carrier for the transmitter, is precisely varied to be used for injection to the intermediate frequency of the receiver.

Figure 2:
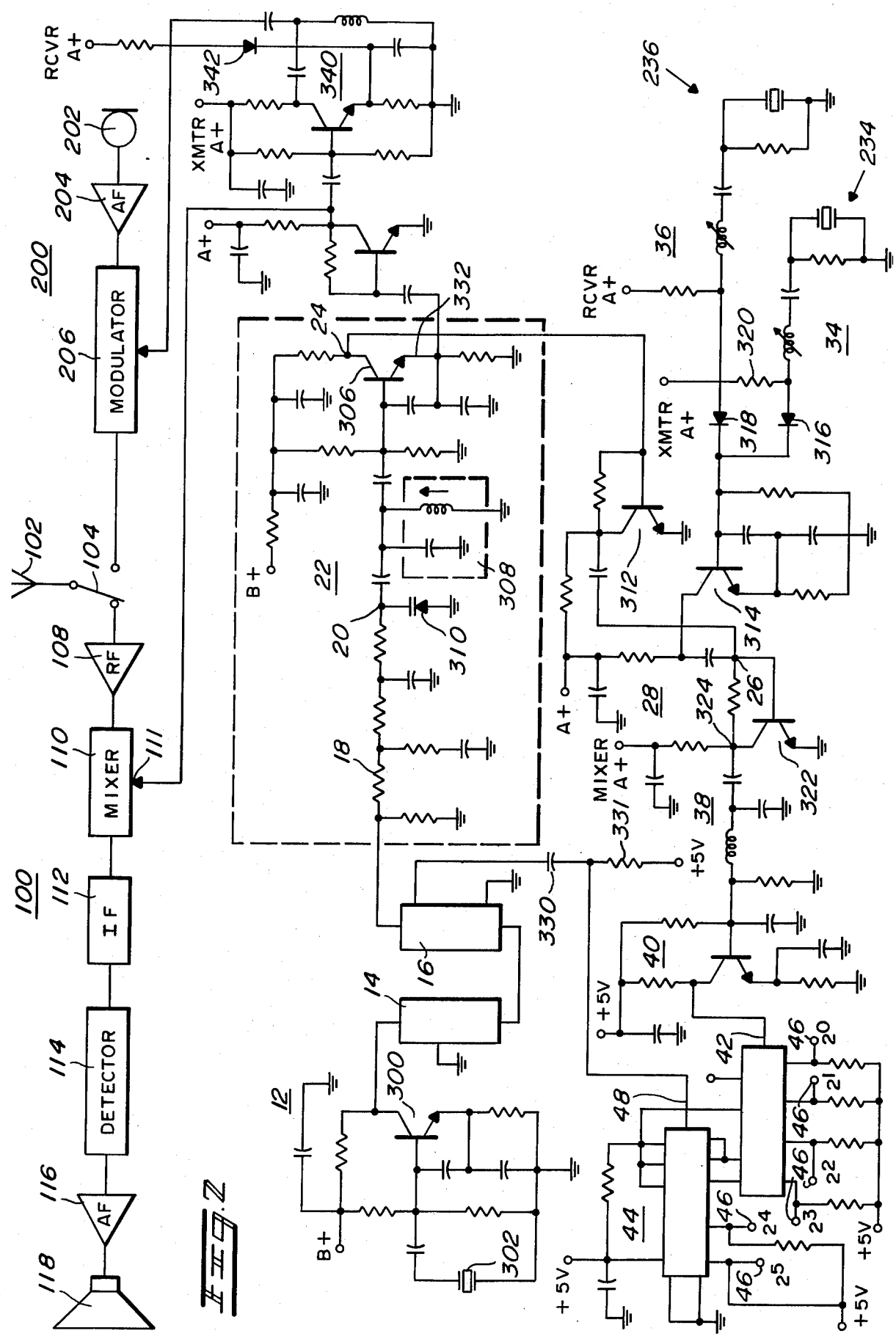
FIG. 2 is a detailed schematic diagram of the preferred embodiment of the frequency synthesizer when used in combination with a radio transceiver.

FIG. 2 is a detailed schematic diagram of the preferred synthesizer when used in conjunction with a radio frequency transceiver. The transceiver is comprised of a receiver portion 100 and a transmitter portion 200. An antenna 102 feeds through a transmit/receive switch 104 to either the input of the receiver 100 or the output stage of the transmitter 200. In the conventional manner, the input to the receiver 100 includes a tuned RF amplifier 108 which feeds to a mixer stage 110. The mixer converts signals from the RF amplifier 108 to an intermediate frequency for processing through an intermediate frequency amplifier and filter 112. The converting frequency to the mixer is provided at mixer input 111 from the synthesizer.

After intermediate frequency amplification and filtering, the received signal is detected in a detector 114 and amplified in an audio amplifier 116. Thereafter the recovered audio information is transduced to audibility in a speaker 118.

The transmitter section is illustrated as having a microphone input 202 which produces an audio signal which couples to an audio frequency amplifier 204. The output from audio frequency amplifier 204 modulates an RF carrier in the modulator and RF amplifier 206. The RF carrier frequency is provided at the output of the synthesizer. The resulting amplitude modulated signal via appropriate switching of transmit/receive switch 104, is broadcast out over antenna 102.

The first stage of the synthesizer is the reference oscillator stage 12. The reference oscillator is of the Colpitts type having an active bipolar transistor 300 being operated at a resonant frequency via a crystal 302. As mentioned with respect to FIG. 1, the reference oscillator produces at the collector of transistor 300, a signal at 2.56 megahertz. The 2.56 megahertz reference oscillator signal is frequency divided by the fixed divider stage 14. In the preferred embodiment of the invention, a standard Motorola part number MC 14040 integrated circuit divider is used.

The output of fixed divider 14 feeds to one input of the phase comparator 16. In the preferred embodiment of the invention, the phase comparator 16 is comprised of a standard Motorola part number MC 14046 integrated circuit. The output from phase comparator 16 is low pass filtered via a standard lag filter type network 18, which results in a DC error signal being applied to the input, or control terminal, of voltage controlled oscillator 22. The voltage controlled oscillator 22 is also a standard Colpitts oscillator having an active device 306 whose frequency of oscillation is dependent on a tank circuit 308 and the capacitance of a voltage controlled capacitor diode 310. The oscillator stage 22 is set up to normally run at approximately 27 megahertz. The channels for citizens band operation extend from 26.965 megahertz to 27.255 megahertz, with the channel spacing of multiples of 10 kilohertz. Thus, when the synthesizer is used to generate the RF carrier at these channel frequencies, the DC error signal applied to the voltage variable capacitor 310 must be adequate for prelocating the frequency of oscillation of oscillator 22 within the desired range. For operation in the receiver mode, the voltage controlled oscillator output varies over the same range, translated 455 kilohertz lower in frequency. The output terminal 24 of voltage controlled oscillator 22 is taken from the collector of transistor 306 and feeds through a buffer stage 312 to one input 26 of the mixer stage 28. The second mixer input 30 feeds from either the transmit oscillator 34 or the receiver oscillator 36. The transmit and receive oscillators are comprised of a single Colpitts arranged active stage 314 which is fed either from a first frequency determining network 234 or a second frequency determining network 236. The frequency determining networks are comprised of crystals and tuning components which, when coupled to the active stage 314 are appropriately chosen to oscillate the stage 314 at a desired frequency. Coupling is done through a pair of diodes 316, 318, respectively. When the synthesizer is in the transmit mode, transmitter A+ is applied via a bias resistor 320 to the first diode 316. This forward biases diode 316 effectively coupling the tuning network 234 to the Colpitts oscillator stage 314. In this mode, receiver A+ is off whereby diode 318 is reverse biased thus effectively isolating tuning circuit 236 from the Colpitts oscillator. In the receive mode receiver A+ is on, and transmitter A+ off, whereby tuning network 236 controls the Colpitts oscillator stage 314.

The mixer input signals at input terminals 26, 30 are of a sufficient magnitude to drive a mixer transistor 322 in its nonlinear range. This produces sum and difference frequencies of the two mixer input signals at the collector 324 of the mixer device 322. A low pass filter 38 processes the mixer output signal and passes only the difference frequency component of the two mixer input signals. The difference signal is amplified and squared in amplifier 40 and thereafter applied to the input terminal 42 of the programmable frequency divider stage 44. In the preferred embodiment of the invention, the programmable divider is comprised of a pair of interconnected integrated circuits, each available as a standard part number 74LS193. The programmable divider 44 has a series of control terminals 46, each of which is representative of an order of magnitude in the binary number system. A 5 volt logic level is applied through bias resistors to each control terminal 46, whereby bias is constantly available at each terminal. A channel selector (not shown) is comprised of a series of switches which ground selected ones of the control terminals 46. The divider responds to appropriate grounding of its control terminals to change the overall divisor, thus producing signals at its output terminal 48 which are predeterminedly frequency divided input terminal 42 signals.

The signals at the divider output are capacitively coupled via DC blocking capacitor and load resistor 331 to the second input of the phase comparator 16, thereby closing the loop. Thus, as mentioned with respect to FIG. 1, the appropriate signals applied to control terminals 46 cause the output 24 of the voltage controlled oscillator 22 to vary in specific increments of frequency in a desired frequency range.

The actual output to the transmitter and receiver is taken from the emitter terminal 332 of the active stage 306. The signal is thereafter passed through a buffer stage to the mixer 110 of the receiver 100, or, in the transmit mode, through an exciter stage 340 to the modulator 206. Notice that only in the transmit mode may the signal be applied to the modulator 206 due to the absence of receiver A+ applied biasing on of stage 340 via transmitter A+ and the absence of receiver A+.

In the receive mode network 236 operates oscillator 314 whereby the output of the voltage controlled oscillator may be controlled in 20 kilohertz segments over the appropriate receiver injection frequency to the mixer 110. In the transmit mode, however, the transmit network 34 controls the Colpitts oscillator 314 whereby the proper RF carrier signals, also operable in 10 kilohertz segments, are applied to the modulator 206.

In summary, a highly accurate, yet relatively inexpensive frequency synthesizer has been disclosed. The synthesizer is shown to have particular utility in a citizens band transceiver.

We claim:

1. A frequency synthesizer for a transceiver comprising:
  a reference oscillator means for generating a predetermined frequency signal;
  a phase comparator means, having a pair of inputs and an output, for producing at its output an error signal representative of the difference in phase of signals applied to its inputs;
  a means for coupling the reference oscillator means to the first phase comparator input;
  a low pass filter means, coupled to the phase comparator output, for filtering the error signal;
  a voltage controlled oscillator means, having a voltage control terminal and an output terminal, for producing an oscillator signal at its output the frequency of which is dependent on the signal applied to the voltage control terminal;
  a means for coupling the filtered error signal to the voltage control terminal of the voltage controlled oscillator means;
  a mixer means, having a pair of inputs and an output, for producing at its output a signal having a frequency equal to the difference in frequency of signals applied at its inputs;
  a means for directly connecting the output of the voltage controlled oscillator to the first input of the mixer means;
  a transmit oscillator for producing a predetermined frequency signal $f_1$;
  a receive oscillator for producing a predetermined frequency signal $f_2$;
  a means for switchably coupling either the transmit oscillator signal or the receive oscillator signal to the second input of the mixer means;
  a means for low pass filtering the output of the mixer means;
  a programmable divider means, having an input, an output, and a plurality of control terminals, for producing at its output a frequency division of a signal received at its input, the frequency divisor being programmably dependent on the signals at the control terminals;
  a channel selector means, coupled to the control terminals of the programmable divider, for selectively controlling the frequency divisor of said divider;
  a means for coupling the low pass filtered mixer output to the input of the progammable divider; and
  a means for coupling the output of the programmable divider to the second input of the phase comparator means,
  whereby the output of the voltage controlled oscillator means is adaptable for tuning the transceiver.

2. The frequency synthesizer of claim 1 wherein the transmit oscillator and the receive oscillator comprise:
  a first frequency determining circuit for tuning to the transmit frequency $f_1$; a second frequency determining circuit for tuning to the receive frequency $f_2$; an amplifier means; and
  the means for switchably coupling either the transmit oscillator signal or the receive oscillator signal to the second mixer input includes means to couple either the first or the second frequency determining circuit in oscillator configuration with the amplifier means.

3. The frequency synthesizer of claim 1 in combination with:
  a transmitter for amplitude modulation of a carrier signal with an information signal;
  a receiver for recovering an information signal from a received signal, said receiver including an intermediate frequency filter;
  a means for processing the output of the voltage controlled oscillator means for producing the carrier frequency in the transmit mode; and
  a means for processing the output of the voltage controlled oscillator means for translating a received signal to the intermediate frequency in the receive mode.

4. The frequency synthesizer of claim 1 wherein the reference oscillator means comprises:
  an oscillator for producing a constant frequency signal; and
  a fixed divider means for frequency dividing the oscillator constant frequency by a fixed divisor.

5. The frequency synthesizer of claim 4 wherein the oscillator produces a constant 2.56 megahertz signal and the fixed divider has a divisor of 256,
  whereby the output of the fixed divider is a 10 kilohertz signal.

6. The frequency synthesizer of claim 1 wherein the difference between the transmit oscillator frequency $f_1$ and the receive oscillator frequency $f_2$ is equal to the intermediate frequency used in the transceiver.

7. The frequency synthesizer of claim 6 wherein the difference between the transmit oscillator frequency $f_1$ and the receiver oscillator frequency $f_2$ is 455 kilohertz.

8. The frequency synthesizer of claim 1 wherein the means for switchably coupling either the transmit oscillator signal or the receive oscillator signal to the second mixer input is comprised of full electronic switching means.

9. The frequency synthesizer of claim 8 wherein the transmit oscillator and the receive oscillator comprise:
a first frequency determining circuit for tuning to the transmit frequency $f_1$; a second frequency determining circuit for tuning to the receive frequency $f_2$; and amplifier means; and
the means for switchably coupling either the transmit oscillator signal or the receive oscillator signal to the second mixer input includes means to couple either the first or the second frequency determining circuit in oscillator configuration with the amplifier means.

10. The frequency synthesizer of claim 9 wherein:
a first diode series couples the first frequency determining network to the amplifier;
a second diode series couples the second frequency determining network to the amplifier; and
a bias network forward biases the first diode and reverse biases the second diode when the transceiver is in the transmit mode and reverse biases the first diode and forward biases the second diode when the transceiver is in the receive mode.

* * * * *